United States Patent [19]
Jimarez et al.

[11] Patent Number: 5,655,703
[45] Date of Patent: Aug. 12, 1997

[54] SOLDER HIERARCHY FOR CHIP ATTACHMENT TO SUBSTRATES

[75] Inventors: Miguel Angel Jimarez, Newark Valley; Amit Kumar Sarkhel, Endicott, both of N.Y.; Lawrence Harold White, Corvallis, Oreg.

[73] Assignee: International Business Machines Corporation, Armonk, N.Y.

[21] Appl. No.: 449,747

[22] Filed: May 25, 1995

[51] Int. Cl.$^6$ ............................ B23K 1/00; B23K 1/018; B23K 31/02
[52] U.S. Cl. .................. 228/180.22; 228/187; 228/191
[58] Field of Search ....................... 228/187, 180.22, 228/233.2, 191, 264

[56] References Cited

PUBLICATIONS

"Reflow Solder Joint with Extended Height," *IBM Tech. Discl. Bull.*, vol. 28, No. 7, Dec. 1985, p. 2871.
Howard H. Manko, *Solders and Soldering*, Second Edition, McGraw–Hill Book Company, New York, pp. 130–135 (Received Apr. 1980).

*Primary Examiner*—P. Austin Bradley
*Assistant Examiner*—Jeffrey T. Knapp
*Attorney, Agent, or Firm*—Douglas M. Clarkson

[57] ABSTRACT

The method for soldering a chip to a substrate to form a module and then soldering the module to a circuit board includes selecting a three level hierarchy of solders by the temperature required to melt. By this method, a module can be soldered to and de-soldered from a circuit board without affecting adversely the solder between the chip and the substrate. The package formed by this method is free of faults that are caused frequently during both manufacture and service.

10 Claims, 1 Drawing Sheet

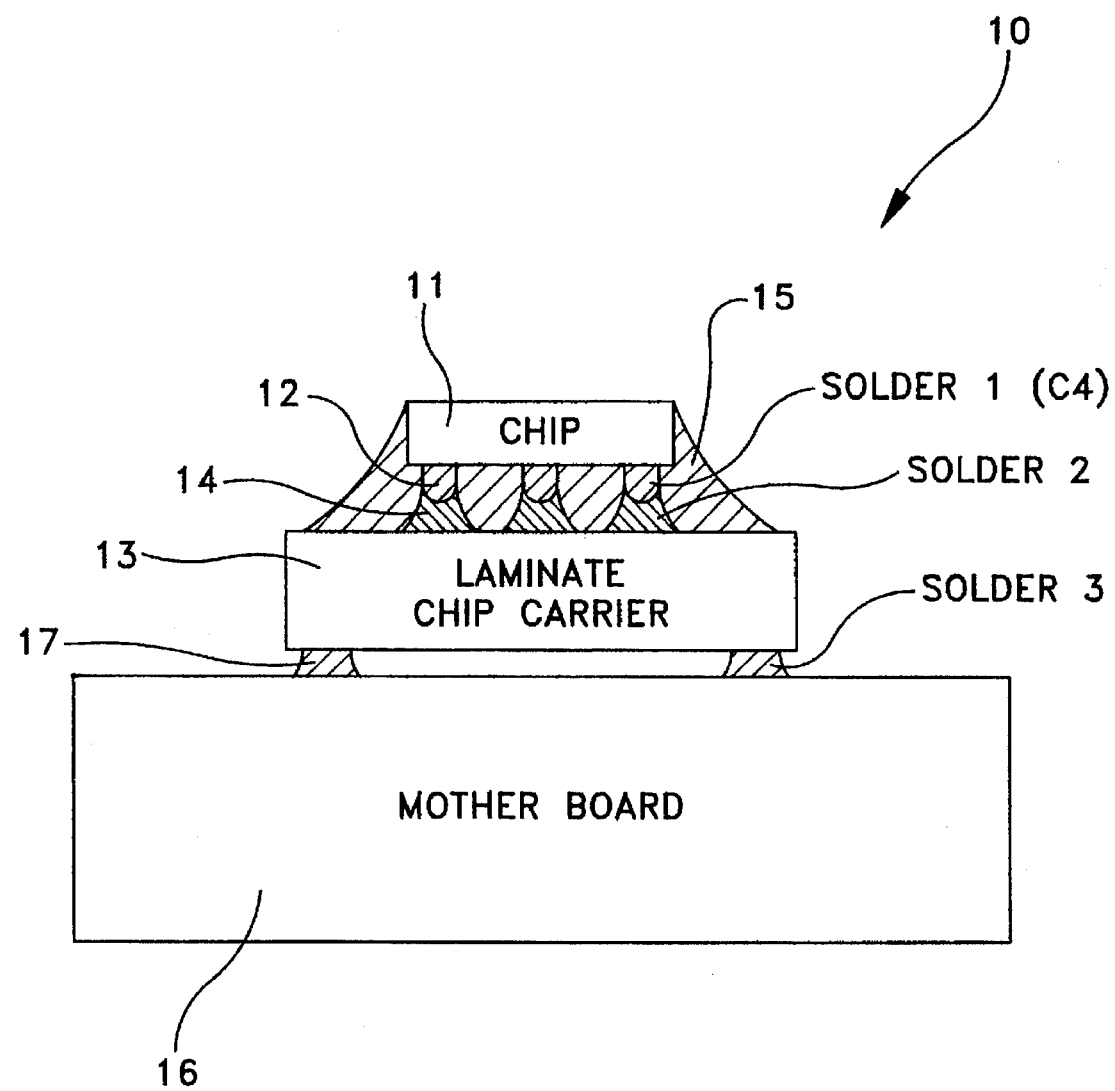

SOLDER HIERARCHY FOR CHIP ATTACHMENT TO SUBSTRATES

BACKGROUND OF THE INVENTION

1. Field of the Invention

The present invention, generally, relates to a process for making organic chip packages and, more particularly, to a new and improved technique by which chips are attached to substrates and substrates are attached to circuit boards that permit the substrates to be removed without affecting other attachments.

In recent years, much effort has been devoted to problems that are involved in soldering laminate chip carriers to circuit boards, and happily, many rather sophisticated problems have been solved by recognizing some of the characteristics and requirements for making the soldering connections between the chip carriers and the circuit boards. Then, before the rejoicing died down, it appeared that all of these efforts were for naught when it was found that in soldering a chip module to a mother board, the solder connections between the chip and the chip carrier in the chip module were damaged severely or destroyed completely.

It has become increasingly evident that chip modules must be removed or de-soldered from a mother board for replacement with a new or updated module or when it becomes necessary to perform other repair work. During these activities, the soldering connections between the chip and the chip carrier of the new module, or other neighboring modules on the mother board, are damaged due to thermal exposure.

An example of the type of soldering connection that is damaged by such repairs or rework is U.S. Pat. No. 4,480,261 to Hattori et al., which explains the problem and describes the complexity involved in developing a solution. This patent is of absolutely no relevance to the present invention, however.

Currently, chips are provided during manufacture with balls of solder at points where they are to be attached to a carrier, module or substrate. These balls are a Pb-Sn solder used by some manufacturers in a technique known as Controlled Collapse Chip Connection (called "C-4").

It is connections involving the C-4 balls that are damaged during heating when a module is removed or otherwise involved in a process requiring a temperature above 183 degrees C. When these connections are subjected to these temperatures, there is flow of molten Sn—Pb eutectic solder into the interface that exists between the chip and the encapsulant material.

In addition to the above identified solder flow during rework temperatures, residual moisture within the chip-carrier assembly will be converted to vapor causing large scale flow of the solder into the chip/encapsulant interface. When this occurs, severe shorting results.

2. Description of the Prior Art

The Assignee of the present invention has devoted substantial research seeking a way to avoid these activities that result in damage to soldering connections between substrates and circuit boards, such as:

U.S. Pat. No. 4,914,814 to Behun et al. describes a process using miniature pins with solder to form a bonding connection.

U.S. Pat. No. 5,060,844 to Behun et al. which describes a use of two solders and an epoxy layer about one of them.

IBM Technical Disclosure Bulletin, Vol. 14, No. 8, January 1972, by Martyak et al. describes the use of two solders in a distinctive structural arrangement to maintain separation.

While the methods and circuit arrangements of the prior art first appearances have similarities with the present invention, they differ in material respects. These differences, as will be described in more detail hereinafter, are essential for the effective use of the invention and which admit of the advantages that are not available with the prior art.

OBJECTS AND SUMMARY OF THE INVENTION

It is an important object of the invention to provide a technique of attachment between a chip, a chip carrier and a circuit board whereby the module may be soldered to and/or de-soldered from the circuit board without disturbing the solder between the chip and the chip carrier.

Another object of the present invention is to provide a solder technique which permits a chip carrier to be exposed to higher temperature limits without damage to its solder connections.

Still another object of the invention is to provide a technique for connecting chips to carriers, modules or substrates that eliminates re-melting of solder connections within the carriers, modules or substrates during later solder work.

Briefly, the technique of the present invention involves attaching a chip to a carrier, and then the carrier to a mother board, by selecting a three level hierarchy of solders by temperature, level one being the highest temperature and level three being the lowest. Solder of level one in the hierarchy is used to form C-4 solder balls on the chip, and solder of level three is used to attach the carrier to a circuit board. Solder of level two in the hierarchy of solders is used to connect the C-4 solder balls to the carrier.

The above and other objects, advantages and features of the present invention will become apparent from the following detailed description of the presently preferred embodiment as illustrated in the accompanying single drawing figure.

BRIEF DESCRIPTION OF THE DRAWINGS

The single drawing figure is a cross sectional view in elevation illustrating a chip attached to a carrier which, in turn, is attached to a circuit board in accordance with the invention.

DETAILED DESCRIPTION OF THE INVENTION

The single drawing figure illustrates a hierarchical selection of solders by their melting temperatures in an arrangement to solve a problem that arises during a process that involves soldering a chip carrier or module to a mother board.

When an assembly, such as that shown in the drawing, is subjected to a temperature above 183 degrees C, problems arise due to several factors, all of which are undesirable. These will be described in more detail as the description of the invention proceeds.

In the drawing, an assembly constructed and arranged according to the principles of the invention is identified, generally, by the numeral 10. A chip 11 has solder balls 12 formed at locations where the chip is to be attached to a carrier 13.

The solder balls 12 are called C-4 solder material, and these usually are pre-formed on chips during manufacture. C-4 solder is a high temperature material which, until about 1990, was formed of 95% Pb—5% Sn, but today it consists of 97% Pb—3% Sn.

When the carrier 13 is soldered to or de-soldered from its circuit board, it is subjected to a temperature of about 183 degrees C. Unless the technique of the present invention is followed, the exposure to this temperature will cause solder 14 to melt, producing the undesirable effects described infra.

For the purposes of the present invention, the C-4 solder can be formed of any high Pb material, for example, in the range of 90% to 97% Pb, with a small percentage of Sn material, for example, in the range of 3% to 10%. These materials melt at a high temperature, such as 300 degree C.

However, when attaching chips to organic carriers to make an organic module, a temperature of 300 degrees C. is too high for organics. Therefore, a solder with a lower melting point, such as a solder in the range 2.0% to 3.5% Ag—98% to 96.5% Sn with a melting temperature in the range of 221 to 229 degrees C, is applied to the organic carrier first. This solder is identified generally in the drawing by the reference number 14.

Now, a chip with the C-4 solder balls 12 is placed, along with an appropriate flux, against the lower temperature solder 14 on the organic carrier, and the temperature is raised to about 240 degrees C. The C-4 solder balls 12 are only wetted by the solder 14, and the solder balls become attached.

Frequently, these modules thus formed are sealed with a suitable encapsulant material 15, but the hierarchical method of the invention is applicable whether the module is encapsulated or not. Normally, such a module will have points on the opposite side, the lower side as viewed in the drawing, for attaching to a circuit board, called "mother" board.

To attach the chip-carrier module to a circuit board 16, a third solder is used having a melting temperature of 179 to 183 degrees C. The third solder is identified generally in the drawing by the reference number 17.

The third solder 17, in accordance with the invention, can be an Ag-modified eutectic solder, such as 62% Sn—36% Pb—2% Ag, which melts at 179 degrees C, or it can be the unmodified eutectic 63% Sn—37% Pb solder which melts at 183 degrees C. The three solders in the hierarchy of solders of the present invention are limited primarily by the temperature at which each melts, rather than a particular material composition of the solder.

In the past, it has been most difficult to attach a chip carrier to a circuit board because severe melting of solder 14 occurred. With the hierarchy of solders of the present invention, some insignificant softening of the solder 14 may occur, but there will be no wholesale melting with the resulting flow of solder into crevices in the encapsulant material causing electrical short circuits and the other problems experienced in the past.

A principal purpose of these solder attachment points is two fold: (1) to form a secure mechanical connection holding the parts physically together as one unit; and (2) to form a good electrical connection between any two points joined. Therefore, it is the intent of the hierarchy of solders to identify the solders by a temperature or a temperature range, rather than by a solder material.

The hierarchy of solders of the invention is most significant when used in the manufacture of organic chip packages, because such packages involve at least one chip attached to an organic substrate by the C-4 method of forming solder joints. Then, the module so formed is encapsulated to form a package.

It is this package formed as just described above that must be attached to a circuit board using solder. In other words, it is such an organic chip package that is subjected to soldering twice. The hierarchy of solders of the invention is less significant when a chip is attached directly to a circuit board where such a circuit board is the final product.

Organic chip modules with which the invention is most applicable are being used increasingly in the manufacture of packages in today's electronic industry. These organic chip modules may have a single chip or a plurality of chips on the top surface of the substrate, the bottom surface of which may have, in place of the usual solder balls, solder lands or solder bumps.

The solder balls, lands or bumps are used for attaching the modules to a circuit board, sometimes called a "mother" board in the electronics industry. It is usual also in this industry that electrical circuits are formed on the top surface of the organic carrier, substrate or laminate.

To summarize the hierarchy of solders technique of the invention, the C-4 solder balls (solder 1 in the drawing) is a high temperature solder that melts at over 300 degrees C. These C-4 solder balls do not melt when the chip is attached to the top surface of a laminate.

The attachment technique of the invention is accomplished by depositing another solder (solder 2 in the drawing) on the top surface of a laminate where the chip is to be connected. Such a solder has a melting temperature of about 220 degrees C, and when attaching the chip, the solder is subjected to a temperature of about 220 degrees C, which is just sufficient to melt it while the solder balls are only softened or wetted.

Following the attachment of the chip to the laminate, if it is to be encapsulated, it is done at this point in the manufacturing process.

When the module formed as described above is to be attached to a circuit board, a eutectic solder (solder 3 in the drawing) is used, such as 63% Sn—37% Pb. Such a solder has a melting temperature in the order of 179 to 183 degrees C, which is about 40 degrees C lower than solder 2.

It is most significant, for the hierarchy of solders of the invention, that while various solder materials may be used, the melting point of solder 2 is intermediate that of solders 1 and 3.

Although the invention has been described in detail, it is understood that changes and modifications can be made. Therefore, the invention is to be limited only by the following claims.

What is claimed is:

1. A method of forming a solder attachment between a chip and a substrate to fabricate a module that permits the module to be attached by soldering to a circuit board without affecting adversely the solder attachment of the chip, comprising:

selecting a three level hierarchy of solders by the temperature required to melt, the first level being the highest temperature, and the third level being the lowest;

applying a solder ball of said first level solder in said three level hierarchy at a point of attachment of a chip;

applying solder of said second level solder in said three level hierarchy of solders at a point of attachment of said solder ball to a substrate to produce a module; and using solder of a third level solder in said three level hierarchy of solders for connecting said module to a circuit board;

whereby said module may be soldered to or de-soldered from said circuit board without melting either said first level solder or said second level solder.

2. A method as defined by claim 1 wherein said third level solder in said three level hierarchy of solders is solder composed of approximately 37% Pb—63% Sn.

3. A method as defined by claim 1 wherein said second level solder in said three level hierarchy of solders is solder composed of approximately 96.5% Sn—3.5% Ag.

4. A method as defined by claim 1 wherein said second level solder in said three level hierarchy of solders has a melting temperature of about 220–240 degrees C.

5. A method as defined by claim 1 wherein said third level solder in said three level hierarchy of solders has a melting temperature of about 180 degrees C.

6. A method as defined by claim 1 wherein said second level solder in said three level hierarchy of solders has a melting temperature intermediate the melting temperatures of said first level solder and said third level solder.

7. A method as defined by claim 1 wherein said first level solder in said three level hierarchy of solders is solder composed of approximately 90% to 97% Pb—10% to 3% Sn.

8. A method as defined by claim 7 wherein said second level solder in said three level hierarchy of solders is solder composed of approximately 96.5% Sn—3.5% Ag, and said third level solder in said three level hierarchy of solders is composed of approximately 37% Pb—63% Sn.

9. A method as defined by claim 1 wherein said first level solder in said three level hierarchy of solders has a melting temperature of at least 300 degrees C.

10. A method as defined by claim 9 wherein said second level solder in said three level hierarchy of solders has a melting temperature of about 220–240 degrees C, and said third level solder in said three level hierarchy of solders has a melting temperature of about 180 degrees C.

\* \* \* \* \*